United States Patent [19]
Wang et al.

[11] Patent Number: 6,020,231
[45] Date of Patent: Feb. 1, 2000

[54] METHOD FOR FORMING LDD CMOS

[75] Inventors: Chih-Hsien Wang; Min-Liang Chen, both of Hsinchu, Taiwan

[73] Assignee: Mosel Vitelic, Inc., Taiwan

[21] Appl. No.: 08/820,246

[22] Filed: Mar. 18, 1997

Related U.S. Application Data

[63] Continuation of application No. 08/437,531, May 9, 1995, abandoned.

[51] Int. Cl.[7] ............................................... H01L 21/8238
[52] U.S. Cl. ........................ 438/228; 438/231; 438/302; 438/595
[58] Field of Search ................................... 438/229–231, 438/302, 525, 595

[56] References Cited

U.S. PATENT DOCUMENTS

| | | | |
|---|---|---|---|
| 5,413,944 | 5/1995 | Lee | 437/34 |
| 5,413,945 | 5/1995 | Chien et al. | 437/35 |
| 5,532,176 | 7/1996 | Katada et al. | 437/34 |

FOREIGN PATENT DOCUMENTS

| | | | |
|---|---|---|---|
| 5-102180 | 4/1993 | Japan | 437/35 |

*Primary Examiner*—Richard Booth
*Attorney, Agent, or Firm*—Townsend and Townsend and Crew LLP

[57] ABSTRACT

A method for fabricating a CMOS integrated circuit device with less masking steps than a conventional device. The present method includes a step of providing a semiconductor substrate with a well region, a gate dielectric layer, and a polysilicon gate electrode. The gate dielectric layer is overlying the well region, and the polysilicon gate electrode is overlying the gate dielectric layer. The present method also includes forming a first thermal oxide thickness overlying the polysilicon gate electrode layer and a second thermal oxide thickness overlying exposed regions. The first thermal oxide thickness is greater than the second thermal oxide thickness, and both layers are defined during the same step. A mask exposes first LDD regions and first source drain regions. The present method then angle implants a first impurity through the first thermal oxide thickness and the second thermal oxide thickness, and implants a second impurity through the second thermal oxide thickness, thereby forming the completed source/drain region in a single masking step.

12 Claims, 7 Drawing Sheets

METHOD FOR FORMING LDD CMOS

This is a Continuation of application Ser. No. 08/437,531 filed May 9, 1995, now abandoned.

BACKGROUND OF THE INVENTION

The present invention relates to semiconductor integrated circuits and their manufacture. The invention is illustrated in an example with regard to the manufacture of a lightly doped drain (LDD) region of a field effect transistor, and more particularly to the manufacture of a complementary metal oxide silicon field effect (CMOS) transistor, but it will be recognized that the invention has a wider range of applicability. Merely by way of example, the invention may be applied in the manufacture of other semiconductor devices such as metal oxide semiconductor field effect (MOS) transistors, bipolar complementary metal oxide semiconductor field effect (BiCMOS) transistors, among others.

Industry utilizes or has proposed several techniques for the manufacture of a CMOS integrated circuit device, and in particularly an LDD CMOS fabrication method. An example of a fabrication process includes steps of defining a gate electrode onto a well region. By way of the gate electrode, an LDD region is formed on to the well region by a self-aligned implant process. Sidewall spacers are then formed on gate electrode sides by a chemical vapor deposition (CVD) technique. A second higher dose implant is then performed within the periphery of the LDD region. The combination of the LDD region and the second higher dose implant defines source/drain regions for the CMOS device. Details of such LDD for CMOS fabrication are illustrated by FIGS. 1–9 below.

A limitation with an LDD structure for a conventional CMOS device is sidewall spacer dimensions are often difficult to control as device geometry decreases. For example, the gate electrode of the conventional device is about 1 micron and below. Accordingly, the sidewall spacers include a corresponding width of about 0.2 micron and less. A conventional fabrication technique for forming such sidewall spacer is by way of CVD formation of an oxide layer, and a subsequent step of anisotropic etching, typically either reactive ion etching or plasma etching. The step of anisotropic etching is often extremely difficult to control accurately, at the smaller dimensions, thereby causing a large variation in spacer widths. The large variation in spacer widths creates devices with differing switching characteristics, which is clearly an undesirable result.

Another limitation with the LDD structure of the conventional CMOS device includes hot electron injection effects, typically electrons inject into the sidewall spacers. The conventional LDD structure often locates more of the N– type (for an NMOS) or P– type (for a PMOS) region outside a region directly underlying a gate electrode, that is, a greater portion of the N– type region or P– type region is underneath the sidewall spacers, rather than directly beneath the gate electrode. When voltage at the gate electrode turns the device on, hot electrons inject into the sidewall spacers, often increasing the resistance in the LDD region directly underneath the sidewall spacers. This tends to cause the LDD regions underneath the sidewall spacers to "pinch off" by way of the higher resistance. Other limitations include a threshold voltage variation, a saturated current variation, a transconductance degradation, and the like.

A PMOS device used in conventional CMOS technology, and in particular an LDD region for the PMOS device includes a further limitation of difficulty with a P– type threshold implant step. The convention PMOS device has oxide spacers made by CVD which are thick, relative to other device dimensions. In fact, the oxide spacers thicknesses range from about 1,500 Å to about 2,000 Å. This means the P– type implant is often deep, and therefore difficult to control. The difficulty in controlling the implant often creates an inconsistent resulting implant. By the inconsistent implant, the conventional PMOS device is often difficult to reduce in size. A punchthrough effect is also difficult to control in the conventional PMOS device, as device dimension decreases.

Still further, it is often desirable to reduce defects in a wafer introduced during its processing. Wafer fabrication processes such as masking, exposing, developing, etching, and others typically introduce particles into an integrated circuit. These particles contribute to the amount of defective integrated circuit chips. Generally, more masks used in a semiconductor process tends to contribute to more defective integrated circuit chips. For example, a conventional CMOS process relies on at least five separate masks to form the LDD and source/drain regions for NMOS and PMOS devices. As industry attempts to increase the yield of good integrated circuit chips on a wafer, it is often desirable to reduce the number of masks (or masking steps) used during wafer manufacture.

From the above it is seen that a method of fabricating a semiconductor LDD structure that is easy, reliable, faster, and cost effective, is often desired.

SUMMARY OF THE INVENTION

The present invention provides a method and resulting integrated circuit device, and in particular a CMOS integrated circuit device having a fabrication method and structure therefor for an improved lightly doped drain region. The present LDD fabrication method provides a relatively consistent and easy to fabricate CMOS LDD region, with less masking steps and improved device performance.

In a specific embodiment, the present invention provides a method of forming a lightly doped drain region (LDD) in an integrated circuit device. The present method includes the steps of providing a semiconductor substrate having a first well region, a first gate dielectric layer, and a first polysilicon gate electrode. The first gate dielectric layer is overlying the first well region, and the first polysilicon gate electrode is overlying the first gate dielectric layer. The present method also includes forming a first thermal oxide thickness overlying the first polysilicon gate electrode layer to define sidewalls and a second thermal oxide thickness overlying exposed regions of the first well region, with the first thermal oxide thickness being greater than the second thermal oxide thickness. A step of angle implanting a first impurity through the first thermal oxide thickness and the second thermal oxide thickness into the first well region to form first a LDD region, and implanting a second impurity through the second thermal oxide thickness into the first well region to form a first source/drain region is also provided.

An alternative embodiment provides a semiconductor integrated circuit which includes a first well region, a first gate dielectric layer, and a first polysilicon gate electrode. The first gate dielectric layer is overlying the first well region, and the first polysilicon gate electrode is overlying the first gate dielectric layer. A first thermal oxide thickness is overlying the first polysilicon gate electrode layer to define sidewalls and a second thermal oxide thickness is overlying exposed regions of the first well region. The first thermal oxide thickness is greater than the second thermal oxide thickness. A step of forming a first LDD region into the first well region by angle implanting a first impurity through the first thermal oxide thickness and the second thermal oxide thickness, and forming a first source/drain region into a periphery of the first LDD region by implanting a second impurity through the second thermal oxide thickness is also provided.

The present invention achieves these benefits in the context of known process technology. However, a further understanding of the nature and advantages of the present invention may be realized by reference to the latter portions of the specification and attached drawings.

DESCRIPTION OF THE SPECIFIC EMBODIMENT

Conventional LDD Fabrication Methods

A simplified conventional LDD fabrication method for a CMOS device may be briefly outlined as follows.

(1) Provide a semiconductor substrate.
(2) Form field oxide by use of the LOCOS technique.
(3) Form P type wells and N type wells.
(4) Grow gate oxide layer.
(5) Implant buried channel region for threshold voltage adjustment.
(6) Deposit gate polysilicon layer (or poly 1 layer) and dope.
(7) Mask 1: Define gate polysilicon layer to form polysilicon gate regions.
(8) Mask 2: Define N– type LDD regions and implant.
(9) Mask 3: Define P– type LDD regions and implant.
(10) Form CVD sidewall spacers on polysilicon gate regions.
(11) Mask 4: Define N+ type source/drain regions and implant.
(12) Mask 5: Define P+ type source/drain regions and implant.
(13) Anneal.

The conventional fabrication method of the LDD structure relies upon at least five mask steps including Masks 1, 2, 3, 4, and 5, and at least four implant steps to form the source/drain regions. It is often desirable to reduce the number of mask steps in use for a particular fabrication process. Furthermore, it is also desirable to reduce damage caused by the implant steps. FIGS. 1–9 illustrate further details of each of the fabrication steps briefly described above.

Figure 1:
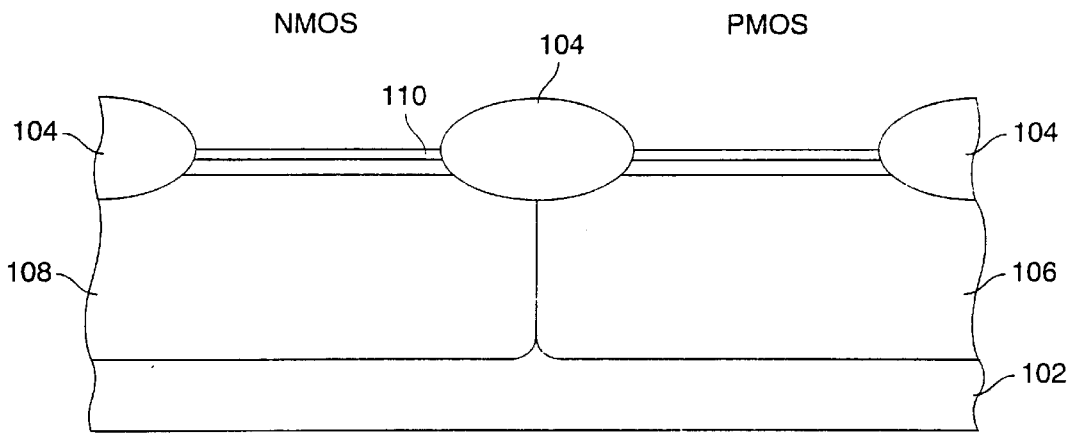
FIGS. 1–9 illustrate a fabrication method for a conventional LDD in a CMOS device.

FIG. 1 illustrates a simplified cross-sectional view of a semiconductor substrate 102, typically the starting point for the fabrication process. Field oxide regions 104 form onto the semiconductor substrate by use of a technique known in the art, such as the local oxidization of silicon (LOCOS). In this CMOS example, a P type well region 108 and an N type well region 106 are defined onto the semiconductor substrate, typically separated by the field oxide region 104. The P type well region 108 and the N type well region 106 define the location for an N type channel device and a P type channel device, respectively. A gate oxide layer 110 is grown overlying both the P type and N type well regions. The gate oxide layer is typically a thin layer of oxide.

Figure 2:
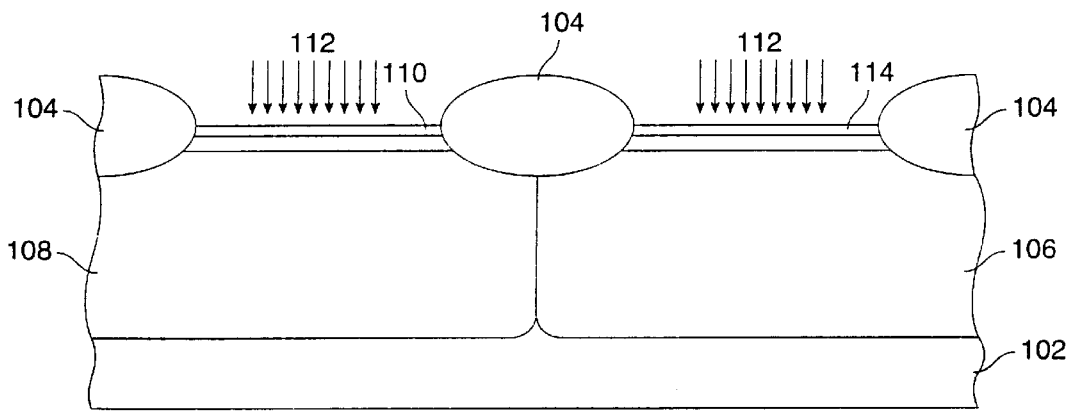

A step of ion implanting P type conductivity impurities 112 then defines the buried region 114 as illustrated by FIG. 2. The ion implant step is often used to adjust the threshold voltage for each of the devices. The channel implant is of P type conductivity.

Figure 3:
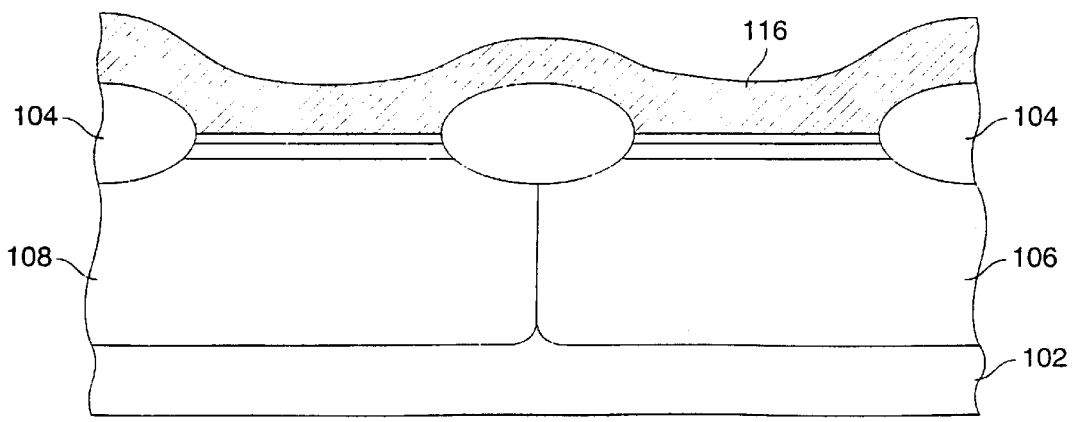

The cross-sectional view of FIG. 3 illustrates a gate polysilicon layer 116 formed overlying the surface of the partially completed device of FIG. 2. The gate polysilicon layer is also known as the poly 1 layer and the like. The gate polysilicon layer is often doped with an N type dopant such as phosphorus and the like.

Figure 4:
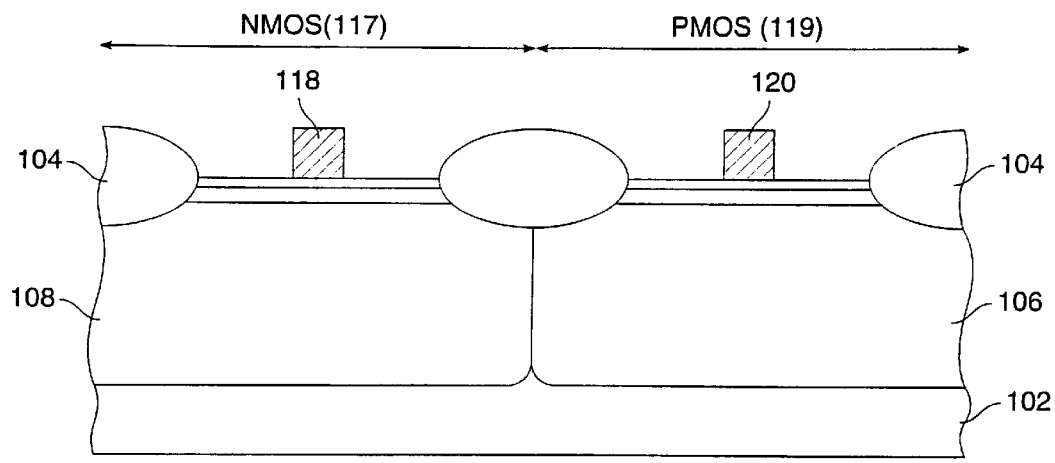

A masking step defines gate polysilicon regions 118 and 120 of FIG. 4 from the gate polysilicon layer 116. In particular, the gate polysilicon region (or gate electrode region) structure is often formed by standard process steps such as masking, exposing, developing, etching, and others. The gate oxide layer typically acts as an etch stop during the etching step, and often remains overlying both the N type and P type well regions. As illustrated, the gate electrode regions include edges having substantially vertical sides. An NMOS device 117 is defined within the P type well region 108, and a PMOS device 119 is defined within the N type well region 106, typifying the CMOS technology.

Figure 5:
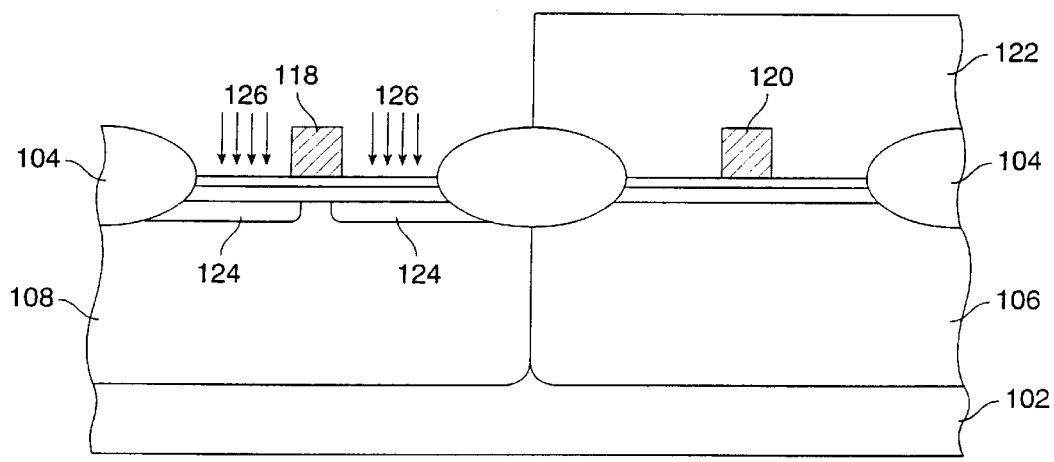
Figure 6:
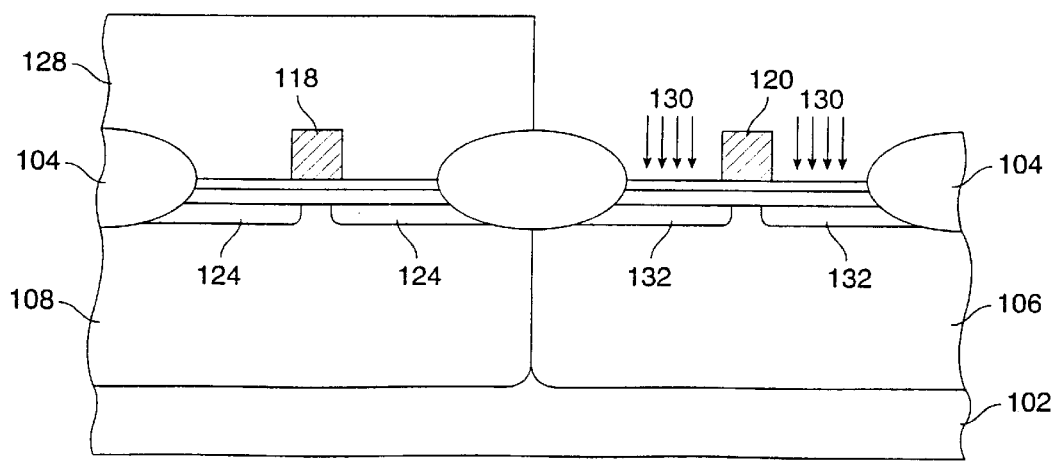

FIGS. 5 and 6 illustrate LDD implants for both the N– type and P– type LDD regions. A mask 122 typically of photoresist overlying the top surface of the substrate exposes regions for the N– type LDD implant 126. The N– type implant forms the N– type LDD regions 124 for an N type channel device (NMOS). The mask 122 is then stripped by way of standard techniques known in the art. Another mask 128 exposes P– type LDD regions for the P– type LDD implant 130. The P– type implant forms the P– type LDD regions 132 for a P type channel device (PMOS). The NMOS and PMOS devices typify the CMOS process. Mask 128 is then stripped.

Figure 7:
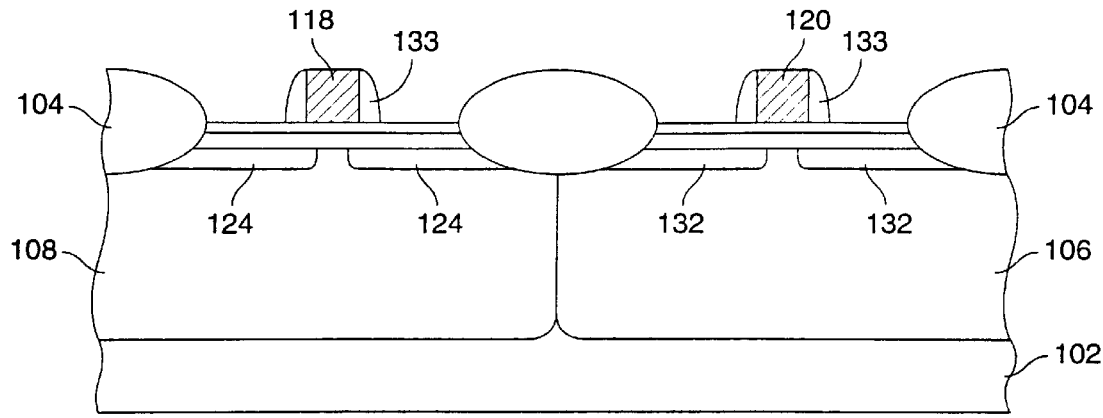

The typical CMOS process then forms CVD sidewalls 133 on each of the gate electrodes 118, 120 as illustrated by way of FIG. 7. The sidewalls are formed by CVD techniques. For example, a blanket CVD layer of oxide is formed overlying the top of the substrate, including gate electrodes and LDD regions. A step of anisotropic etching removes portions of the oxide layer on horizontal surfaces while leaving the oxide layer on the vertical surfaces intact. The remaining oxide layer defining the sidewalls is often densified, subsequently. This sequence of steps forms conventional sidewalls. A greater portion of the LDD region often underlies the sidewall than a region directly underneath the gate electrode. The conventional LDD structure contributes to the hot electron injection problem. Also, the conventional sidewall made of CVD oxide is difficult to fabricate accurately as its dimension decreases to about 0.15 micron and less.

Figure 8:
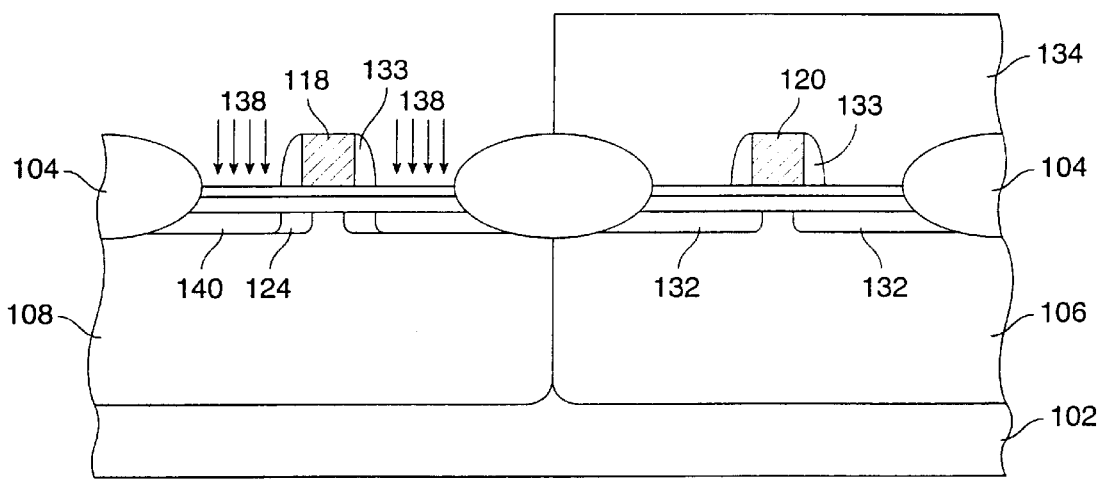
Figure 9:
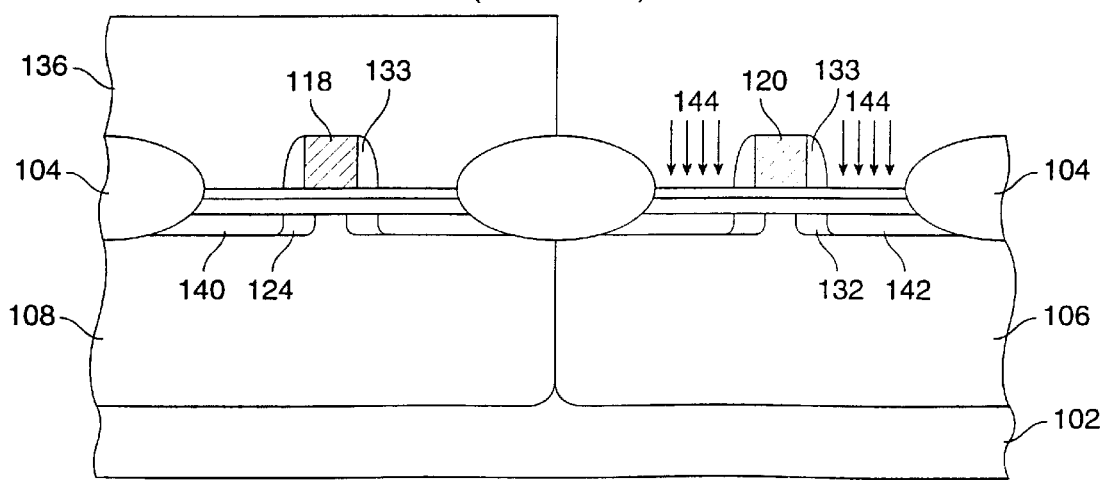

FIGS. 8 and 9 illustrate a method of forming source/drain regions 140, 142 for the NMOS device and the PMOS device, respectively. A mask 134 exposes the regions for the NMOS source/drain implants, typically an N+ type implant 138. The mask 134 is stripped by way of any known technique, and another mask 136 exposes regions for the PMOS source/drain implants, typically a P+ type implant 144. Mask 136 is then stripped. The final LDD structure in the conventional CMOS example is illustrated by FIG. 10.

Conventional LDD Structures

Figure 10:
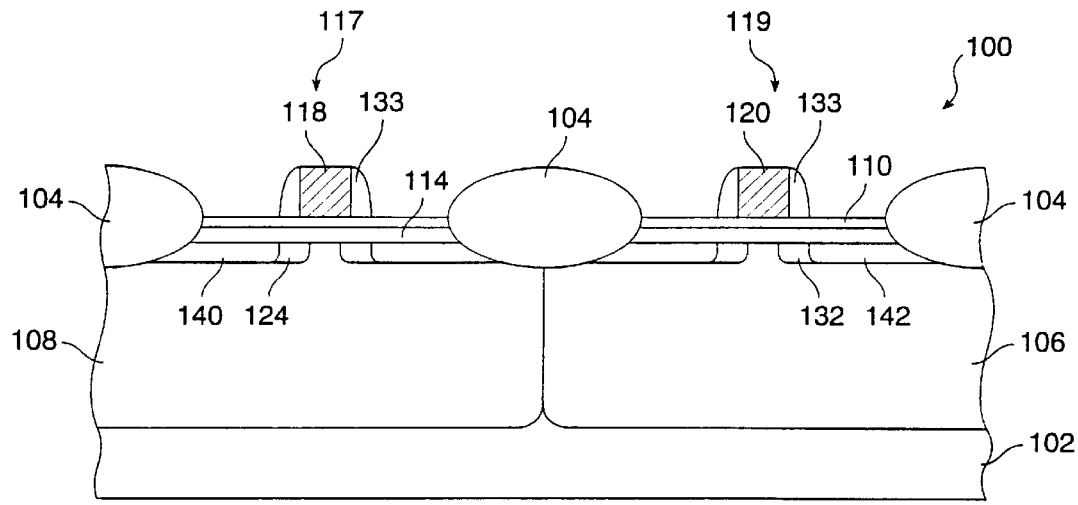
FIG. 10 illustrates a simplified cross-sectional view of the conventional LDD structure according to FIGS. 1–9.

FIG. 10 is a simplified cross-sectional view 100 of a conventional LDD regions for a CMOS device. The CMOS device includes an NMOS device 117, and a PMOS device 119. The NMOS and CMOS devices are defined in a P type well region 108 and an N type well region 106, respectively. Both P type and N type well regions are formed onto a semiconductor substrate 102. Field isolation oxide regions 104 typical formed by a technique known as the local oxidation of silicon (LOCOS) are often used to isolate and/or separate adjacent devices 117, 119 from each other. A gate oxide layer 110 is formed over both the P type and the N type well regions, and gate electrodes 118, 120 are defined overlying the gate oxide layer 110.

Both NMOS and PMOS devices include LDD regions 124 and 132. A portion of the LDD regions 124, 132 are defined underneath the gate electrodes 118, 120. But another portion of the LDD regions 124, 132 are defined outside the gate electrode underlying sidewalls 133. The sidewalls 133 typically oxides are formed at edges of the gate electrodes 118, 120. An N+ type region 140 is defined within a perimeter of the N− type LDD region 124. A P+ type region 142 is defined within a perimeter of the P− type LDD region 132. A combination of the N− type and N+ type region defines a source/drain region of the NMOS device, and a combination of the P− type and + type region define a source/drain region of the PMOS device.

Switching each of the devices occurs by applying a voltage to the gate electrode. The voltage at the gate electrode forms a channel underneath the gate electrode. In the NMOS device, an N type channel of conductive material connects the source and drain regions together by way of voltage applied to the gate electrode, thereby switching the device to an "ON" state. Alternatively, when no voltage is applied to the gate electrode, P type semiconductor material isolates source region from the drain region. In the PMOS device, a P type channel of conductive material connects the source and drain regions together by way of voltage applied to the gate electrode. This switches the PMOS device to an "ON" state. Alternatively, the PMOS device is in an "OFF" state when no voltage is applied to the gate electrode.

The CMOS device of FIG. 10 defines an active region of a typical semiconductor chip. An active area of the chip often includes hundreds, thousands, or even millions of these microscopically small regions, each defining an active device. Of course, the particular use of the MOS device depends upon the particular application.

Present CMOS LDD Fabrication Methods

An embodiment of the present LDD fabrication method for a CMOS device may be briefly outlined as follows.

(1) Provide a semiconductor substrate.
(2) Form field isolation oxide.
(3) Form P type wells and N type wells.
(4) Grow gate oxide layer.
(5) Implant buried channel region for threshold voltage adjustment.
(6) Deposit gate polysilicon layer (or poly 1 layer) and dope.
(7) Mask 1: Define gate polysilicon layer to form polysilicon gate regions.
(8) Form a thermal oxide layer on the polysilicon gate regions to define sidewalls, and a thermal oxide layer on exposed portions of the P type wells and N type wells (later known as source/drain regions).
(9) Mask 2: Define N type source/drain regions and angle implant N− type LDD regions and implant N+ type source/drain regions.
(10) Mask 3: Define P type source/drain regions and angle implant N− type LDD regions and implant P+ type source/drain regions.
(11) Anneal.

The embodiment of the present LDD fabrication method includes the use of three masking steps Mask 1, 2, and 3 to form the LDD source/drain structures. Step (9) is also interchangeable with step (10), that is, the P type source/drain regions may be formed before the N type source drain regions. By way of less masking steps, the present CMOS LDD fabrication method provides a simplified method which often takes less time to process than the prior art method as described above. Less time in processing translates to faster turn-around-time and a more efficient processing technique.

FIGS. 11–17 illustrate an embodiment of a fabrication method for an LDD structure in a CMOS device according to the present invention. The embodiment of FIGS. 11–17 is shown for illustrative purposes only, and therefore should not limit the scope of the invention recited by the claims. Furthermore, the method depicted by the FIGS. 11–17 is not necessarily to scale unless indicated otherwise.

Figure 11:
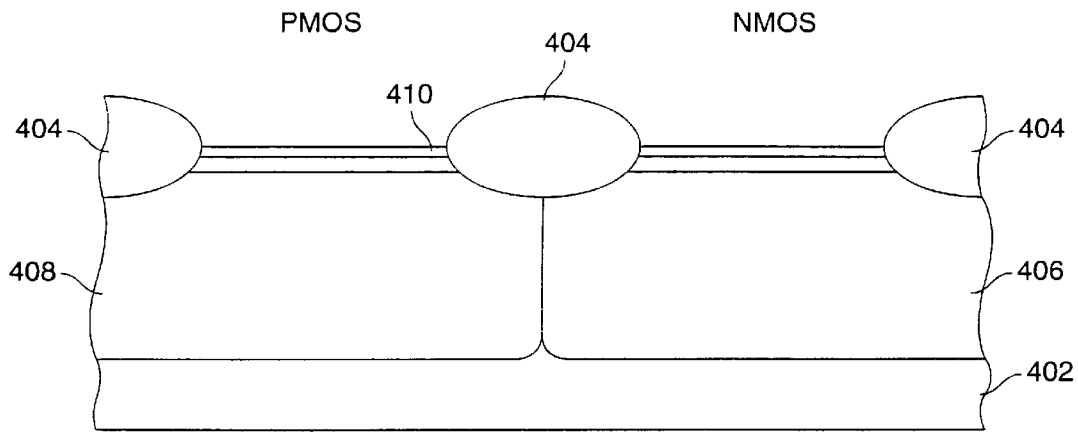
FIGS. 11–17 illustrate an embodiment of a fabrication method for an LDD in a CMOS device according to the present invention.

FIG. 11 illustrates a partially completed semiconductor integrated circuit device according to the present invention. The partially completed device includes a semiconductor substrate 402, and field isolation oxide regions 404 formed thereon by use of a technique such as the local oxidation of silicon (LOCOS) or the like. LOCOS is typically used as a starting point for providing regions on the substrate used for device fabrication. However, other techniques may also be used depending upon the particular application.

The substrate includes a P type well region 406 and an N type well region 408, typifying a CMOS process. An N type channel MOS device and P type channel PMOS device are defined onto the P type well region 406 and the N type well region 408, respectively. Alternatively, the well regions may be N type and P type depending upon the particular application.

A gate oxide layer 410 is formed overlying the top surface of both the P type and the N type well regions. The gate oxide layer 410 is high quality oxide, and is also typically thin to promote efficient switching of the device. The gate oxide layer is often a thermally grown layer, substantially free of pin holes and the like. The thickness of such gate oxide layer typically ranges from about 40 Å to about 100 Å, and preferably about 60 Å. Of course, the particular thickness depends upon the application.

Figure 12:
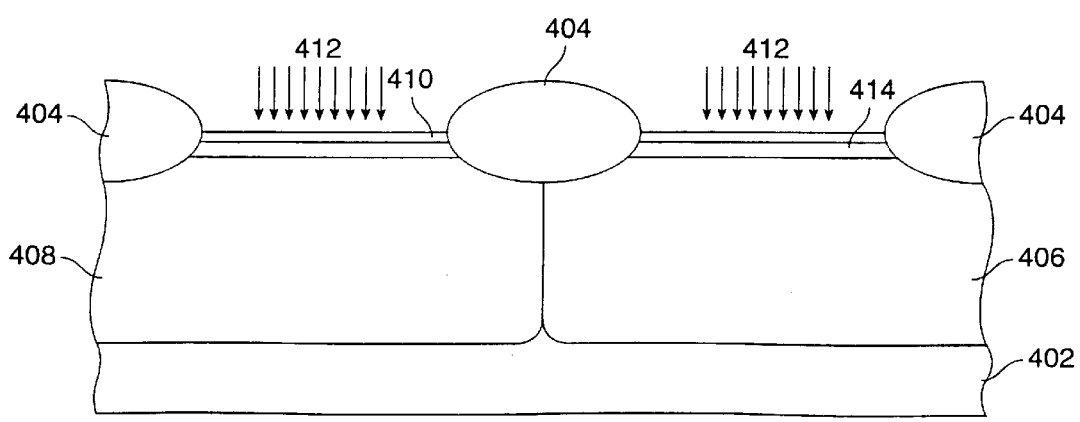

Impurities for the buried channel layer 412 are typically implanted into and are preferably through the thin layer of oxide overlying the substrate as illustrated by FIG. 12. The thin layer of oxide acts as a "screen" and often protects the underlying single crystal substrate from excessive damage caused by the implant. The impurities for the buried channel layer may either be N type or P type, depending upon the particular application. In this CMOS example, the impurities are P type, and at a concentration ranging from about $1\times10^{12}$ and $1\times10^{13}$ atoms/cm$^3$ and is preferably at about $3\times10^{12}$ atoms/cm$^3$. Of course, the exact dose should provide for the desired threshold voltage characteristics for the NMOS and PMOS devices.

Figure 13:
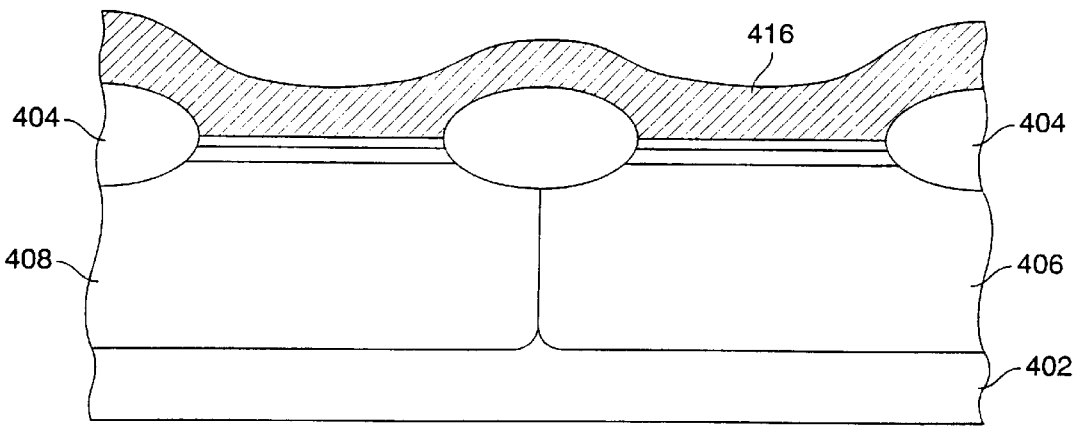

A polysilicon layer 416 is formed over the substrate surface and in particular an oxide as illustrated by FIG. 13. A thickness of the polysilicon layer 416 is likely range from about 2,500 Å to about 3,500 Å, and is preferably at about 3,000 Å. The polysilicon layer is also typically doped with an N type impurity at a concentration of from about $3\times10^{20}$ to about $8\times10^{20}$ atoms/cm$^3$, and is preferably at about $5 \times 10^{20}$ atoms/cm$^3$. Of course, the polysilicon layer and its dose depend upon the particular application.

Figure 14:
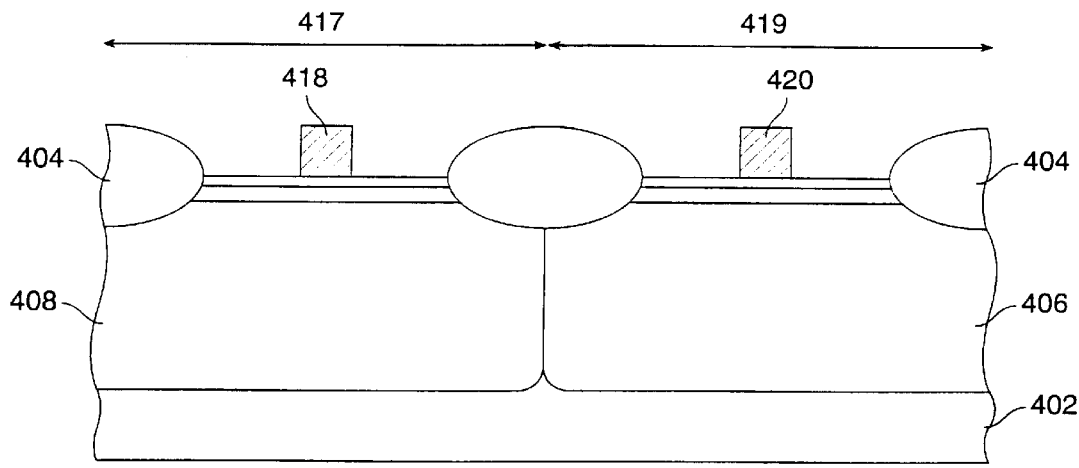

The polysilicon layer 416 is defined to form polysilicon gate electrodes 418, 420 as illustrated by FIG. 14. Sites for a PMOS device 417 and an NMOS device 419 are also shown. The gate electrodes are often formed by any suitable series of photolithographic steps such as masking, developing, etching, and others. Each gate electrode includes edges having substantially vertical features, but may also have features which are not substantially vertical. The substantially vertical features are often made by way of an anisotropic etch step and the like.

Figure 15:
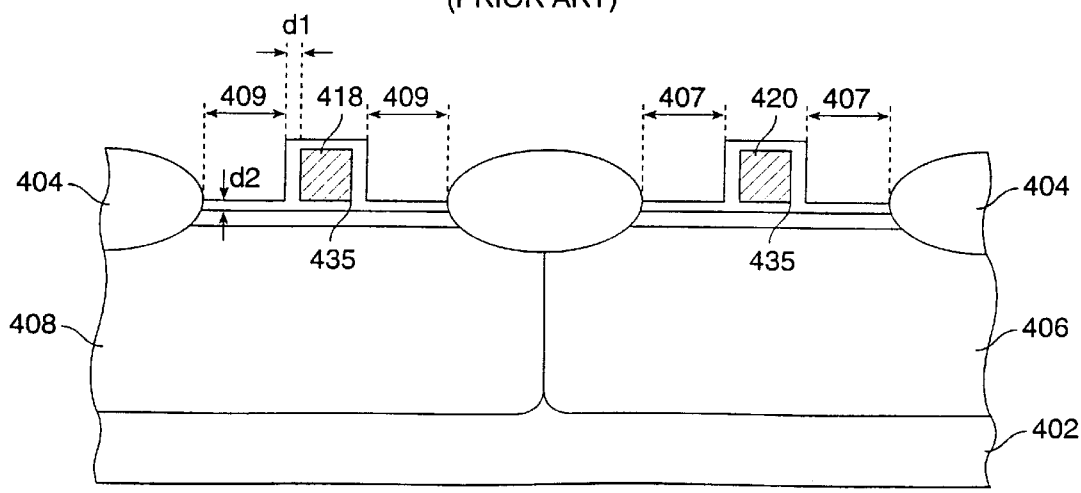

A layer of dielectric material is defined overlying the gate electrodes 418, 420 and portions 407, 409 of exposed P type and N type well regions as illustrated in FIG. 15. The dielectric layer is preferably an oxide of high quality such as a thermal oxide layer and the like. A first dielectric layer portion such as an oxide is formed by heat treatment overlying the gate electrodes. A thickness (d1) of such dielectric layer portion ranges from about 200 Å to about 400 Å, and preferably about 300 Å. Another dielectric layer portion such as an oxide is formed overlying portions 407, 409 of the exposed P type and N type well regions during the same heat treatment step. A thickness (d2) of such second dielectric layer portion ranges from about 100 Å to about 300 Å, and is preferably about 200 Å. The difference in thicknesses between the portions occurs by way of differing underlying materials such as single crystal silicon of the substrate and polysilicon of the gate electrodes. The thickness d1 is preferably greater than the thickness d2.

During the heat treatment step, edges 435 of each of the gate electrodes decompose into oxide faster than sidewall portions. The edges become rounded, away from the underlying gate oxide layer. The rounded edges remove force and/or stress which exists on the gate oxide layer from the conventional gate electrode structure. To form the rounded edges, the thermal anneal or thermal oxidation occurs using nitrogen $N_2$ as a carrier gas and oxygen $O_2$ as a reactant gas at, for example, a temperature ranging from 700 to 900° C., and preferably about 800° C. The process time for thermal oxidation ranges from 20 to 40 minutes, and is preferably 30 minutes.

Figure 16:
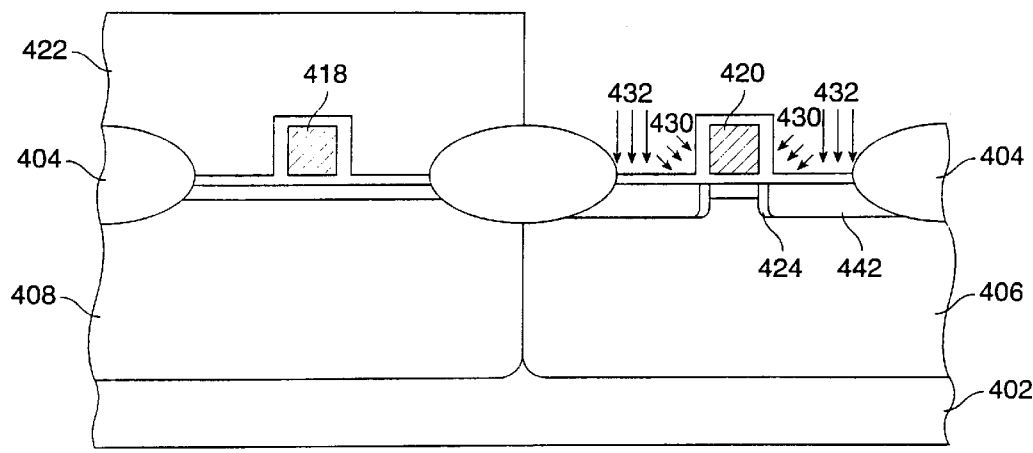

In the embodiment, a mask 422 typically of photoresist is defined overlying N type well regions to expose P type well regions for selected N type implants of source/drain regions as illustrated by FIG. 16. The gate electrode 420 is used as a mask to define N− type LDD regions 424. The N− type impurity is implanted 430 preferably by way of an angle implant of a phosphorous type material. The angle implant occurs substantially at an intersection region between the gate electrode 420 and exposed P type well region. The N− type implant has a concentration ranging from about $1 \times 10^{13}$ atoms/cm$^3$ and $5 \times 10^{13}$ atoms/cm$^3$, and is preferably at about $2 \times 10^{13}$ atoms/cm$^3$. The angle at which the implant takes place ranges from angles greater than about 20 degrees but less than about 60 degrees, and is preferably at about 30 degrees from a line perpendicular to a channel direction.

A second implant 432 is performed into the source/drain regions to define N+ type regions 442. The second implant occurs with an impurity such as arsenic and the like. The implant is performed from an angle of about zero degree but less than about 10 degrees, and is preferably at about 7 degrees from a line perpendicular to a channel direction. An arsenic implant concentration ranges from about $3 \times 10^{15}$ atoms/cm$^3$ and $6 \times 10^{15}$ atoms/cm$^3$, and is preferably at about $4 \times 10^{15}$ atoms/cm$^3$. A combination of the N− type implant and the N+ type implant defines the N type LDD source/drain structure for the NMOS device. Alternatively, the N+ implant is performed before the N− implant. Of course, the exact angle, concentration, and impurity type depend upon the particular application.

Figure 17:
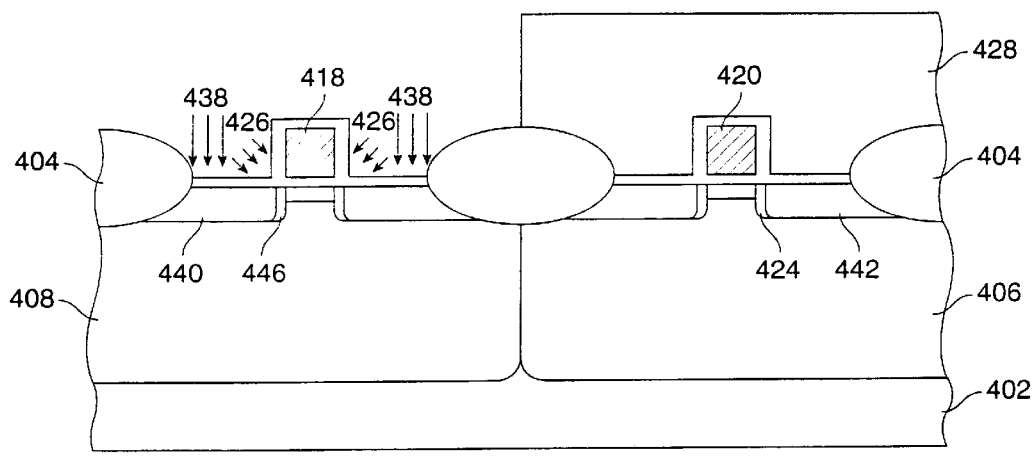

A mask 428 typically of photoresist protects the regions defined for the NMOS devices, and exposes source/drain regions for P type source/drain regions is illustrated by FIG. 17. The gate electrode 418 is used as a mask to define P+ type regions 440. The P+ type impurity is implanted 438 preferably by way of an angle implant of a boron type material. The boron type material may include for example $BF^2$ and the like. The implant is performed from an angle of about zero degree but less than about 10 degrees, and is preferably at about 7 degrees from a line perpendicular to a channel direction. The boron implant concentration ranges from about $1 \times 10^{15}$ atoms/cm$^3$ to about $5 \times 10^{15}$ atoms/cm$^3$, and is preferably at about $2 \times 10^{15}$ atoms/cm$^3$.

A second implant 426 is performed into the source/drain regions to define N− type LDD regions 446. The second implant occurs with an impurity such as boron and the like. The angle implant occurs substantially at an intersection region between the gate electrode 418 and exposed N type well region. The N− type implant is at a concentration ranging from about $1 \times 10^{13}$ atoms/cm$^3$ and about $4 \times 10^{13}$ atoms/cm$^3$, and is preferably at about $3 \times 10^{13}$ atoms/cm$^3$. The angle at which the implant takes place ranges from angles greater than about 20 degrees but less than about 60 degrees, and is preferably at about 30 degrees from a line perpendicular to a channel direction. A combination of the N− type implant and the P+ type implant defines the P type LDD source/drain structure for the PMOS device. Alternatively, the N− type implant is performed before the P+ type implant. It should be noted that the combination of the N− type implant and P+ type implant reduces the punchthrough effect of the conventional PMOS LDD structure. Of course, the exact angle, concentration, and impurity type depend upon the particular application.

In an alternative embodiment, the N type source/drain implant and the P type source/drain implant corresponding respectively to the NMOS device and the PMOS are interchangeable. The P type source/drain region including the P+ type regions and the N− type regions are defined onto the semiconductor substrate. The N type source/drain regions defined by the N+ type regions and the N− type regions are later formed onto the semiconductor substrate. Of course, the exact doping sequence will depend upon the particular application.

Present LDD Embodiments

Figure 18:
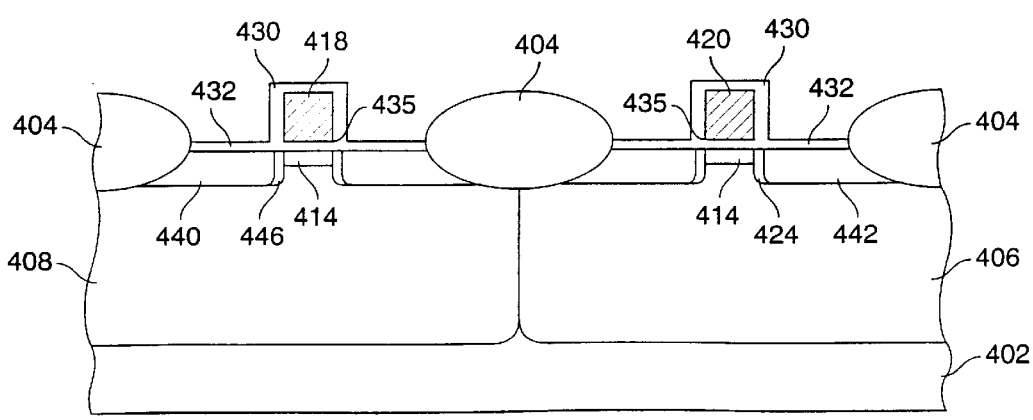
FIG. 18 illustrates a simplified cross-sectional view of the LDD structure according to FIGS. 11–17.

FIG. 18 is a simplified cross-sectional view of an embodiment 400 of an LDD structure for a CMOS device according to the present invention. The present LDD structure includes an NMOS device and a PMOS device, typifying the CMOS technology. Both devices are defined onto a semiconductor substrate 402. The devices are each separated by a field oxide isolation region 404. The field oxide isolation region 404 is often made by a process such as LOCOS and the like. The NMOS device has elements such as N− type LDD regions 424, N+ source/drain regions 442, and a threshold implant region 414, all formed in a P type well region 406. The NMOS device also includes a gate electrode 420, a gate oxide layer 410, a thermal oxide spacer region 430, a thermal oxide layer 432, and the like. It should be noted that the length of the N− type LDD region underlying the gate electrode 420 is greater than the length of the LDD region underlying the thermal oxide spacer 434. This structure tends to prevent the hot electron injection problem of the conventional device.

The PMOS device includes elements such as P+ type source/drain regions 440, P− type LDD regions 446, and a threshold implant region 414, all formed within an N type well region 408. The PMOS device also has a gate electrode 418, a thermal oxide spacer region 430, a thermal oxide layer 432, a gate oxide layer 410, and the like. A length of the P− type LDD region underlying the gate electrode is larger than a length of such region underlying the sidewall spacers, thereby reducing the amount of hot electrons injected into the sidewall spacers.

The present CMOS embodiment 400 includes a channel width for each PMOS and NMOS device at about 0.5 micron and less. By this width, the present thermal oxide layer is preferably made by way of heat treatment. Heat treatment of the gate electrode layer made of polysilicon and the single crystal silicon substrate provides a high quality oxide layer which is substantially pin hole free. The thermal oxide layer is also easy to control by way of time and temperature variations. A thickness d1 of the thermal oxide gate layer ranges from about 200 Å to about 400 Å, and is preferably at about 300 Å. The thickness d2 of the thermal oxide layer ranges from about 100 Å to about 300 Å, and is preferably at about 200 Å. Preferably, the thickness d1 is greater than the thickness d2 by about 40% to about 60%, and is preferably at about 50%.

By way of the present thermal oxide layer, no reactive ion etch or plasma etch technique need be performed to fabricate the sidewall spacers of the conventional device. In addition, the present thermal oxide layer provides for an effective channel length of a transistor of about 0.5 microns and less and preferably about 0.35 microns and more preferably 0.25 microns and less. Of course, the dimensions used for each particular device depends upon the particular application.

Figure 18A:
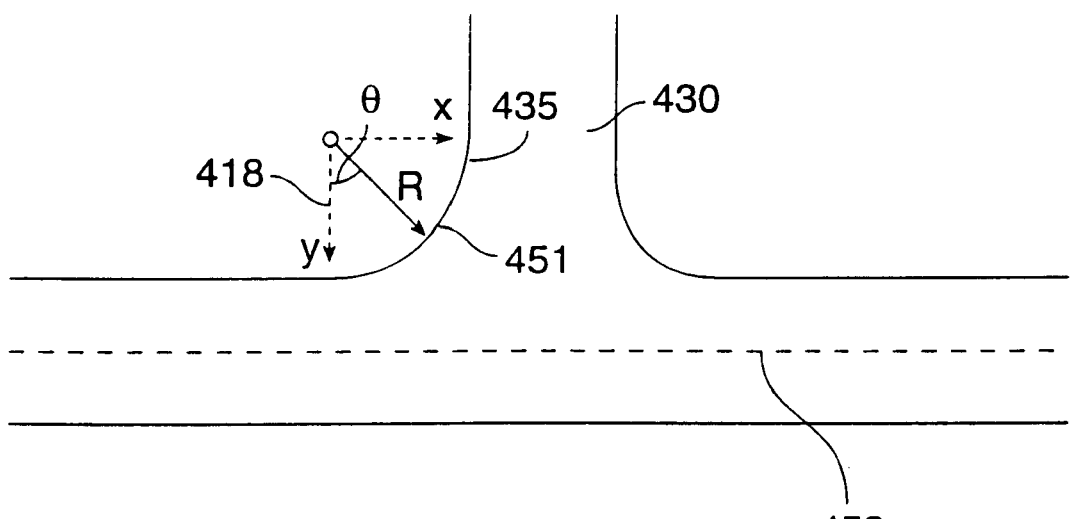
FIG. 18A is a simplified gate portion of the LDD structure of FIG. 18.

In the present CMOS device, each gate electrode includes a substantially rounded corner (defined as an outer surface region 435 at about radius R) which includes an outside edge 451 region (defined as a portion of the rounded corner where radius R ranges from about 40° to about 50° from the y-axis) overlying the gate oxide layer as further illustrated by FIG. 18A. A gate electrode with substantially rounded corners reduces gate edge stress, which can apply pressure on the underlying layer of gate oxide. By the substantially rounded corner feature of each gate electrode, potential damage caused by gate edge stress is reduced, thereby improving gate oxide layer quality and performance. The corner of the gate electrode includes a radius of curvature at about 250 Å and greater, and is preferably 3,00 Å and greater. The gate electrode outside edge 451 ranges from about 250 Å to about 300 Å, and is preferably about 280 Å from the upper surface 453 of the "original" gate electrode layer as defined by the previous FIGS. The rounded corner of the gate electrode is made by way of the heat treatment of the gate electrode.

The present CMOS device also uses less masking steps than the conventional device illustrated by FIGS. 1–10. In fact, the present device can be formed by way of three masking steps, rather than the conventional five masking steps. A less number of masking steps translates into lower costs of manufacture, and faster device turn-around-time. In addition, by way of less masking steps, the introduction of defects through particles also decreases, thereby improving device yield and providing lower costs per die.

Experiments

To prove the principle of the present invention, an experiment was performed. In the experiment, a CMOS device including an NMOS device and a CMOS device was fabricated. In the NMOS device source/drain regions, an N− type impurity was about $3 \times 10^{13}$ atoms/cm$^3$, and an N+ type impurity was about $4 \times 10^{15}$ atoms/cm$^3$. The N− type impurity was phosphorus and the N+ type impurity was arsenic. In the PMOS device source/drain regions, an N− type impurity at about $3 \times 10^{13}$ atoms/cm$^2$, and a P+ type impurity at about $2 \times 10^{15}$ atoms/cm$^2$. The P+ type impurity was boron and the N− type impurity was phosphorus. The NMOS and PMOS devices each included a transistor channel length of about 0.35 microns, and a gate oxide layer thickness of about 70 Å. The N− type and P− type regions were implanted at an angle of about 30 degrees from a perpendicular to a channel region, and N+ type and P+ type source/drain regions were implanted at an angle of about 7 degrees from a perpendicular to a channel region.

Both NMOS and PMOS devices also had a thermal oxide thickness overlying the gate polysilicon gate at about 300 Å, and a thermal oxide thickness overlying exposed portions of the source/drain regions at about 200 Å.

In the present three mask CMOS fabrication method, the NMOS device and the PMOS device had the following electrical characteristics.

TABLE 1

Electrical Characteristics of NMOS and PMOS devices

| DEVICE | L (μm) | $V_t$ (V) | $I_{sat}$ (μA/μm) | $L_{eff}$ (μm) | $I_{off}$ (pA/μm) |
|---|---|---|---|---|---|
| NMOS | 0.35 | 0.7 | 550 | 0.13 | 0.04 |
| PMOS | 0.35 | 0.9 | 220 | 0.34 | 0.4 |

Based upon Table 1, the electrical characteristics of both the NMOS and PMOS devices were good. For example, the leakage currents of $I_{off}$ (at $V_d$=3.3 volts and $V_g$=0.0 volt) for both devices were relatively small, while the saturation currents $I_{sat}$ (at $V_g$=$V_d$=3.3 volts) were relatively large. It is often desired to have such large relative difference between the leakage current and saturation current. The threshold voltages ($V_t$) for the NMOS and PMOS devices were 0.7 volt and 0.9 volt, respectively. The electrical characteristics of the devices clearly support the use of the present three mask step for CMOS LDD fabrication.

While the above is a full description of the specific embodiments, various modifications, alternative constructions and equivalents may be used. For example, while the description above is in terms of an LDD structure in a CMOS integrated circuit device, it would be possible to implement the present invention with BiCMOS, MOS, or the like.

Therefore, the above description and illustrations should not be taken as limiting the scope of the present invention which is defined by the appended claims.

What is claimed is:

1. A method of forming a lightly doped drain region (LDD) in an integrated circuit device comprising:

providing a semiconductor substrate comprising a first well region, a first gate dielectric layer, and a first polysilicon gate electrode, said first gate dielectric layer overlying said first well region, and said first polysilicon gate electrode overlying said first gate dielectric layer; said first polysilicon gate electrode having a length of about 0.35 micron and less;

forming a first thermal oxide thickness overlying said first polysilicon gate electrode layer and a second thermal oxide thickness overlying exposed regions of said first gate dielectric layer, said first thermal oxide thickness being greater than said second thermal oxide thickness;

angle implanting a first impurity through said first thermal oxide thickness and said second thermal oxide thickness into said first well region to form first LDD regions; and implanting a second impurity through said second thermal oxide thickness into said first well region to form first source/drain regions;

wherein said first gate electrode includes an edge overlying said first gate dielectric layer, said edge having a substantially round corner region which reduces gate edge stress on said first gate dielectric layer, said substantially round corner including a radius of curvature of about 250 Å and greater to reduce a gate edge stress, thereby improving said gate dielectric layer.

2. The method of claim 1 wherein said first impurity and said second impurity comprise P type materials.

3. The method of claim 1 wherein said first impurity and said second impurity comprise N type materials.

4. The method of claim 1 wherein said angle implanting step occurs at an angle ranging from about 20 degrees to about 60 degrees from a line perpendicular to a channel region.

5. The method of claim 1 wherein said implanting step occurs at an angle ranging from about 0 degrees to about 7 degrees from a line perpendicular to a channel region.

6. The method of claim 1 wherein said first thermal oxide thickness ranges from about 200 Å to about 400 Å.

7. The method of claim 1 wherein said second thermal oxide thickness ranges from about 100 Å to about 300 Å.

8. The method of claim 1 wherein said semiconductor substrate further comprises a second well region, a second gate dielectric layer, and a second polysilicon gate electrode, said second dielectric layer overlying said second well region, and said second polysilicon gate electrode overlying said second gate dielectric layer, said second polysilicon gate electrode having length about 0.35 micron and less, said method further comprising steps:

forming a third thermal oxide thickness overlying said second polysilicon gate electrode and a fourth thermal oxide thickness overlying exposed regions of said second gate dielectric layer, said third thermal oxide thickness being greater than said fourth thermal oxide thickness;

angle implanting a third impurity through said third thermal oxide thickness and said fourth thermal oxide thickness into said second well region to form second LDD regions; and implanting a third impurity through said third thermal oxide thickness into said second well region to form second source/drain regions;

wherein said second gate electrode includes an edge overlying said second rate dielectric layer, said edge having a substantially round corner region which reduces gate edge stress on said second gate dielectric layer, said substantially round corner of said second gate electrode including a radius of curvature of about 250 Å and greater to reduce a gate edge stress of said second gate electrode, thereby improving said second gate dielectric layer.

9. The method of claim 8 wherein said angle implanting step occurs at an angle ranging from about 20 degrees to about 60 degrees from a line perpendicular to a channel region.

10. The method of claim 8 wherein said implanting step occurs at an angle ranging from about 0 degrees to about 7 degrees from a line perpendicular to a channel region.

11. The method of claim 8 wherein said third thermal oxide thickness ranges from about 200 Å to about 400 Å.

12. The method of claim 8 wherein said second thermal oxide thickness ranges from about 100 Å to about 300 Å.

* * * * *